US006263471B1

United States Patent
Huang

(10) Patent No.: US 6,263,471 B1
(45) Date of Patent: Jul. 17, 2001

(54) METHOD AND APPARATUS FOR DECODING AN ERROR CORRECTION CODE

(75) Inventor: Ke-Chiang Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/263,102

(22) Filed: Mar. 5, 1999

(51) Int. Cl.[7] ................................................. H03M 13/15
(52) U.S. Cl. ............................................................ 714/784
(58) Field of Search ............................................. 714/784

(56) References Cited

U.S. PATENT DOCUMENTS

| | | | |
|---|---|---|---|
| 4,845,713 | 7/1989 | Zook et al. | 371/37 |
| 4,873,688 | 10/1989 | Maki et al. | 371/37.1 |
| 4,958,348 | 9/1990 | Berlekamp et al. | 371/37.1 |
| 5,170,399 | 12/1992 | Cameron et al. | 371/37.1 |
| 5,323,402 | 6/1994 | Vaccaro et al. | 371/37.1 |
| 5,396,502 | 3/1995 | Owsley et al. | 371/37.1 |
| 5,428,628 | 6/1995 | Hassner et al. | 371/37.1 |
| 5,442,578 | 8/1995 | Hattori | 364/746.1 |
| 5,517,509 | * 5/1996 | Yoneda | 371/37.1 |
| 5,570,378 | 10/1996 | Inoue et al. | 371/37.1 |
| 5,737,343 | * 4/1998 | Meyer | 371/37.1 |

OTHER PUBLICATIONS

Stephen B. Wicker, et al., "Reed–Solomon Codes and Their Applications," IEEE Press, 1994.
S. Lin, et al., "Error Control Coding: Fundamentals and Applications," Prentice–Hall, Inc. Englewood Cliffs, NJ, 1983, pp. 161–165.
Whiting, "Bit–Serial Reed–Solomon Decoders in VLSI", Ph.D Thesis, California Institute of Technology, pp. 108–118, Dec. 1985.*

* cited by examiner

Primary Examiner—Stephen M. Baker
(74) Attorney, Agent, or Firm—Stevens, Davis, Miller & Mosher, LLP

(57) ABSTRACT

A bit-serial key-equation solver employs the modified Euclidean algorithm to determine an error location polynomial and an error evaluation polynomial for decoding Reed-Solomon codes. The key equation solver includes a one-bit quotient bus for bit-serially transmitting the digits of a quotient value and a plurality of processing units each of which bit-serially receives the quotient digits from the one-bit quotient bus and each of which can be configured as a serial-in parallel-out (SIPO) standard basis bit-serial multiplier. Swapping and shifting of the register contents is also bit-serial. The key equation solver needs only the standard basis.

10 Claims, 12 Drawing Sheets

METHOD AND APPARATUS FOR DECODING AN ERROR CORRECTION CODE

BACKGROUND OF THE INVENTION

1. Field of the Invention

This invention relates generally to error-correction coding in digital communications and storage devices. More specifically, the present invention relates to a method and apparatus for solving the key equation to decode Reed-Solomon (RS) codes utilizing the modified Euclidean algorithm to generate an error location polynomial and an error evaluation polynomial.

2. Description of the Related Art

Bose-Chaudhuri-Hocquenghem (BCH) codes form a large class of powerful random error correcting cyclic codes. Among the nonbinary BCH codes, the most important subclass is the class of Reed-Solomon codes. Reed-Solomon codes are equivalent to a BCH code with the code symbol field being the same as the field of the roots of the code generator polynomial. Reed-Solomon codes have been widely used in digital communications and data storage devices (e.g. compact discs) in such a way that induced errors are efficiently correctable. The most commonly used approach to constructing the Reed-Solomon codes is the generator polynomial construction represented by BCH codes.

The following references, incorporated by reference herein in their entireties, are helpful to achieve a general understanding of the principles of Reed-Solomon codes: (1) Stephen B. Wicker and Vijay K Bhargava, *Reed-Solomon Codes and Their Applications*, IEEE Press, 1994; (2) E. Dahlman, K. Shu Lin, and Daniel J. Costello, Jr., *Error Control Coding: Fundamentals and Applications* Prentice-Hall, Inc. Englewood Cliffs, N.J., 1983.

Generally, the arithmetic of error correction codes is based on a finite (Galois) field $GF(2^m)$ which is the extension field of $GF(2)$ and is generated by a field generator polynomial $f(x)$ of degree m with binary coefficients (0,1) in $GF(2)$. For example, assuming $\alpha$ is a primitive element in $GF(2^m)$ satisfying $f(\alpha)=0$, then the set $\{1, \alpha, \alpha^2, \ldots, \alpha^{m-1}\}$ is called the standard basis that spans $GF(2^m)$. In field $GF(2^m)$, a primitive element is defined as an element that has order $2^m-1$. The order n of an element $\alpha$ in $GF(2^m)$ is defined as the smallest positive integer such that $\alpha^n=1$. Any finite field element $\beta$ can be expressed in the standard basis as $$\beta=\beta_0+\beta_1\alpha+\beta_2\alpha^2+\ldots+\beta_{m-1}\alpha^{m-1} \quad (1)$$

where the binary digits $\{\beta_0, \beta_1, \ldots, \beta_{m-1}\}$ represent the standard coordinates of $\beta$.

For convenience, $\beta_{m-1}$ is referred to as the most significant bit (MSB) and $\beta_0$ as the least significant bit (LSB). All arithmetic operations in $GF(2^m)$ are performed by exclusive OR (XOR) gates which perform modulo 2 addition (modulo 2 subtraction is equivalent to addition) and AND gates which perform modulo 2 multiplication.

A Reed-Solomon code (n,k,t) over $GF(2^m)$ can correct up to t error symbols, where $GF(2^m)$ is a finite field with $2^m$ m-bit symbols, n is the total number of symbols in a code word, k is the number of information symbols in a code word, n−k is the number of check symbols in a code word and t=(n−k)/2.

The RS code is defined by a code generator polynomial $G(x)$ of degree 2t with $\{1, \alpha, \alpha^2, \ldots, \alpha^{2t-1}\}$ as its roots. Any legal code word, treated as a polynomial of degree n−1, must be divided by $G(x)$.

The following table represents the RS codes in the digital television standard of the United States Advanced Television Systems Committee (ATSC) and the Standard of Digital Video Broadcasting by Satellite (DVB-S) of the European Telecommunications Standard Institute (ETSI), where m=8 (eight-bit symbol=one byte).

|   | ATSC | DVB-S |
|---|------|-------|
| k | 187  | 188   |
| n | 207  | 204   |
| t | 10   | 8     |
| m | 8    | 8     |

A brief description of the conventional error correcting procedure with regard to a Reed-Solomon code (n,k,t) will be given below. In this description, we assume that $R_i$, $i=0,1,2,\ldots,n-1$, are the n received error-corrupted m-bit symbols.

Step (1): Generate 2t syndrome values $$s_i = \sum_{j=0}^{n-1} R_j(\alpha^i)^j, \text{ for } 0, 1, 2, \ldots, 2t-1 \quad (2)$$

and then, based on these syndrome digits, form a syndrome polynomial $S(x)$ of degree 2t−1 representing the received codeword $$S(x) = \sum_{i=0}^{2t-1} s_i x^i \quad (3)$$

Step (2): Solve the key equation $$\Omega(x)=\Lambda(x)S(x) \bmod x^{2t} \quad (4)$$

using the modified Euclidean algorithm to generate an error location polynomial $\Lambda(x)$ of degree t and an error evaluation polynomial $\Omega(x)$ of degree t−1;

Step (3): Determine the roots of $\Lambda(x)$ by the Chien search method, each of which indicates an error location. If $\alpha^{-\mu}$ is a root of $\Lambda(x)$, there is an error in the received symbol $R_\mu$ and the associated error value is given by the Forney algorithm $$\Omega(\alpha^{-\mu})/\Lambda_{odd}(\alpha^{-\mu}) \quad (5)$$

where $\Lambda_{odd}(x)$ is the polynomial of preserving the odd terms of $\Lambda'(x)$, the terms associated with $\{x, x^3, x^5, \ldots\}$.

Step (4): Correct the errors by subtracting the error magnitudes from the received codeword in the associated error locations.

It should be noted that, as used herein, the term "received codeword" refers to a codeword that is either received through a communication medium or reproduced from a storage medium.

The modified Euclidean algorithm for solving the key equation is mathematically described as follows, starting with $S(x)$ generated in accordance with step (1) above:

Initialization: $A(x)=S(x), A'(x)=1, B(x)=x^{2t}, B'(x)=0$ (6)

Euclidean Iteration:
if deg_A(x)<deg_B(x) then
  swap A(x) and B(x)
  swap A'(x) and B'(x)
endif $$Q = a_{lead}/b_{lead} \quad (7)$$

$$A(x) \leftarrow A(x) - Q \cdot B(x) \cdot x^{deg\_A(x) - deg\_B(x)} \quad (8)$$

$$A'(x) \leftarrow A'(x) - Q \cdot B'(x) \cdot x^{deg\_A(x) - deg\_B(x)} \quad (9)$$

if deg A(x)<t, then
  algorithm finished $$\Omega(x) = A(x) \quad (10)$$

$$\Lambda(x) = A'(x) \quad (1)$$

endif where $a_{lead}$ represents the leading coefficient of A(x), $b_{lead}$ represents the leading coefficient of B(x), and "deg" means the degree of polynomial.

The notation ← means "simultaneous assignment upon Euclidean iteration."

As to Q, it is typically obtained by computing the multiplication of $$Q = a_{lead} \cdot INV \quad (12)$$

where $$INV = (b_{lead})^{-1} \quad (13)$$

and the value of INV is typically generated by a look-up table.

A brief description of prior art hardware implementations of a key equation solver for Reed-Solomon codes is given below.

Conventional key equation solvers using parallel multipliers are illustrated by, for example, U.S. Pat. Nos. 4,873,688, 5,170,399, 5,396,502, 5,428,628, 5,442,578, and 5,570,378. In these systems, generally, a global m-bit parallel bus is used to transmit the m-bit quotient value Q, and m-by-m parallel multipliers are used to perform the multiplication function. The parallel multiplier operates in parallel-in parallel-out (PIPO) mode, completes its operation in one clock, and requires $m^2$ AND gates and at least $m^2$ XOR gates. Thus, these systems have the disadvantage of incurring large gate counts and requiring an m-bit quotient bus.

Systolic implementations of the key equation solver using parallel multipliers are disclosed in, e.g., U.S. Pat. Nos. 4,958,348 and 5,323,402. In these systems, a set of registers is used for storing A(x), A'(x), B(x), B'(x), INV, Q, deg_A(x), and deg_B(x), while another set of registers is used to pipeline data transfer and perform arithmetic operations. Thus, these systems have the disadvantage of needing extra registers to pipeline data transfer and processing.

In the prior art discussed above, m-by-m parallel multipliers are implemented by an array of $m^2$ AND gates and $m^2$ XOR gates such that the required multiplication task is completed in one clock cycle. In general, a key equation solver needs more than 2t multipliers.

One way to reduce the number of gates is to use bit-serial multipliers, each of which needs m sequential clock cycles to complete a multiplication while its gate number is only proportional to m. U.S. Pat. No. 4,845,713 is an example of a bit-serial multiplier configuration providing a key equation solver using parallel-in serial-out (PISO) dual-basis bit-serial multipliers. However, this system has the disadvantage of requiring a basis change; using dual-basis requires extra serial-to-parallel registers and extra circuitry for the basis change between standard basis and dual basis.

FIG. 1 shows a conventional cellular VLSI key equation solver 5 using the modified Euclidean algorithm. The arithmetic computations of equations (8) and (9) are performed using parallel multipliers 6 in a processing unit (PU) 7, which includes m-bit registers REG U(i) and REG L(i), i=1,2, ... ,2t+2. Other functions for realizing the modified Euclidean algorithm are carried out by processing unit 7. As the modified Euclidean algorithm proceeds, the degrees of A(x) and B(x) decrease while the degrees of A'(x) and B'(x) increase. Register degA and register degB are used to indicate the degrees of A(x) and B(x) respectively. The upper-side m-bit registers U(i), i=1,2, ... ,degA+1, are used to store the coefficients of A(x). The upper-side m-bit registers U(i), i=degA+2, ... ,2t+2, are used to store the coefficients of B'(x). The lower-side m-bit registers L(i), i=1,2, ... ,degB+1, are used to store the coefficients of B(x). The lower-side m-bit registers L(i), i=degB+2, ... ,2t+2, are used to store the coefficients of A'(x). Registers U(1), L(1), U(2t+2), and L(2t+2) represent the leading coefficients of A(x), B(x), B'(x), and A'(x), respectively. The m-bit register REG_Q and the m-bit register REG_INV are used to store the values Q and INV, respectively. In particular, the m-bit register REG_Q produces an m-bit quotient value that is transmitted in parallel by a global m-bit parallel quotient bus 18.

FIG. 2, is a flow chart showing the operations of the key equation solver circuit of FIG. 1. In FIG. 2, S(i), Λ(i), and Ω(i) represent the coefficients of $x^i$ of the syndrome polynomial S(x), the error location polynomial ·(x), and the error evaluation polynomial Ω(x), respectively.

The INITIALIZATION block 20 represents an algorithm initialization stage in which (1) syndrome polynomial S(x) is assigned to A(x); (2) $x^{2t}$ is assigned to B(x); (3) degA and degB are set to 2t; (4) A'(x) is set to one; and (5) B'(x) is set to zero. The Euclidean iteration starts in the CONTROL block 22. In decision block 22A, the ending condition is checked to determine whether the modified Euclidean algorithm is completed. If yes, then, in ending block 28, the error location polynomial Λ(x) is given by the polynomial A'(x), and the error evaluation polynomial Ω(x) is given by the polynomial A(x). On the other hand, if decision block 22A determines that the modified Euclidean algorithm is not completed, then the CONTROL block 22 will decide which of ARITH block 24, SHIFT block 25 or SWAP block 26 is to be performed for the present Euclidean iteration.

In the ARITH block 24, the arithmetic computations of equations (8) and (9) are executed. In SHIFT block 25, the contents of registers U(•) are shifted left by one register position, and the register degA is decreased by one. In SWAP block 26, the contents of registers U(Ω) and registers L(•) are swapped, and the registers degA and degB are adjusted accordingly. If ARITH block 24 is performed in the present iteration, U(1) will become zero. Then, in the next iteration, SHIFT block 25 or SWAP block 26 will be performed to adjust the contents of U(•) and/or L(•) and to recompute the value of Q.

Due to the implementation of the parallel multipliers, the CONTROL block 22, ARITH block 24, SHIFT block 25, and SWAP block 26 are all completed in one clock cycle.

SUMMARY OF THE INVENTION

In view of the foregoing disadvantages of the prior art, it is an object of the present invention to provide an improved method and apparatus for decoding an error correction code. It is a further object to provide a method and apparatus for solving the key equation to decode a Reed-Solomon code using the modified Euclidean algorithm while utilizing bit-serial multipliers of the serial-in parallel-out (SIPO) type to reduce the required combinational logic gates.

In accordance with this invention there is provided an apparatus for solving the key equation for decoding an error correction code defined over $GF(2^m)$, the apparatus comprising a one-bit quotient bus for bit-serially transmitting m quotient digits of an m-bit quotient value Q; and a plurality of processing units each bit-serially receiving the quotient digits from the one-bit quotient bus and each including: (i) a first m-bit register; (ii) an m-by-one multiplier; (iii) a second m-bit register; and (iv) an adder. The m-by-one multiplier multiplies the m-bit contents of the first register by one of the quotient digits received from the one-bit quotient bus to generate an m-bit multiplication output. The second register and the adder are in the form of an accumulator for accumulating the m-bit multiplication output of the m-by-one multiplier. The first register is wired to form a linear feedback shift register which replaces its m-bit contents by the m-bit value resulting from multiplying its m-bit contents by $\alpha$, with $\alpha$ being a non-zero element of $GF(2^m)$. The first and second m-bit registers can be configured as bit shift registers. The apparatus may further comprise an inversion means for generating an m-bit output in response to an m-bit value received from one of the processing units; and a quotient means for generating the m quotient digits by multiplying the m-bit output of the inversion means by an m-bit value received from one of the processing units and for transmitting the m quotient digits bit-serially on the one-bit quotient bus.

In accordance with this invention there is further provided an error correction circuit for correcting bit errors in a received codeword encoded by an error correction code over $GF(2^m)$, the circuit comprising: means for generating a syndrome polynomial $S(x)$ by computing power sums of symbols of the received codeword; means for solving the key equation $\Omega(x)=\Lambda(x)S(x) \bmod x^{2t}$ to generate an error location polynomial $\Lambda(x)$ representing error locations of the errors in the codeword and an error evaluation polynomial $\Omega(x)$ used to determine error values of the errors; means for determining roots of the error location polynomial $\Lambda(x)$, each of the roots indicating an error location; means for determining error values from the roots; and means for generating a corrected codeword from the error locations, the error values and the received codeword, wherein the means for solving the key equation comprises a one-bit quotient bus for bit-serially transmitting m quotient digits of an m-bit quotient value and a plurality of processing units each bit-serially receiving the quotient digits from the bus and each including: (i) a first m-bit register; (ii) an m-by-one multiplier for multiplying contents of the first register by one of the quotient digits received from the bus to produce an m-bit parallel multiplication result; (iii) a second m-bit register; and (iv) an adder for adding the m-bit multiplication result with contents of the second register to provide an m-bit addition result for replacing the contents of the second register, wherein the m-by-one multiplier comprises m AND gates, the adder comprises m exclusive OR gates, and the second register and the adder are configured to provide an accumulator for accumulating the m-bit multiplication result of the m-by-one multiplier. The apparatus may further comprise an inversion means for generating an m-bit output in response to an m-bit value received from one of the processing units; and a quotient means for generating the m-bit quotient value by multiplying the m-bit output of the inversion means by an m-bit value received from one of the processing units and for transmitting the m-bit quotient value bit-serially on the bus. The first m-bit register forms a linear feedback shift register which multiplies contents of the first register by $\alpha$ and stores the multiplication result back to the first register, where $\alpha$ is a non-zero element of $GF(2^m)$.

In accordance with this invention there is further provided a method of performing arithmetic operations for solving the key equation for decoding an error correction code defined over $GF(2^m)$, each of the arithmetic operations including m computation steps each comprising: receiving one of m quotient digits of an m-bit quotient value; multiplying contents of a first plurality of m-bit registers by the received quotient digit to produce a plurality of first m-bit parallel multiplication results; accumulating the plurality of first m-bit parallel multiplication results in a second plurality of m-bit registers; and replacing the contents of the first plurality of m-bit registers by the results of multiplying themselves by $\alpha$.

In accordance with yet another aspect of this invention, there is provided a method of correcting bit errors in a received codeword encoded by an error correction code over $GF(2^m)$, the method comprising: generating a syndrome polynomial $S(x)$ by computing power sums of symbols of the received codeword; solving the key equation $\Omega(x)=\Lambda(x) S(x) \bmod x^{2t}$ to generate an error location polynomial $\Lambda(x)$ representing error locations of the errors in the received codeword and an error evaluation polynomial $\Omega(x)$ used to determine error values of the errors; determining roots of the error location polynomial $\Lambda(x)$, each of the roots indicating an error location; determining error values from the roots; generating a corrected codeword from the error locations, the error values and the received codeword, wherein the step for solving the key equation performs arithmetic operations each including m computation steps each of which includes receiving one of m quotient digits of an m-bit quotient value, multiplying contents of a first plurality of m-bit registers by the received quotient digit to produce a plurality of first m-bit parallel multiplication results, accumulating the plurality of first m-bit parallel multiplication results in a second plurality of m-bit registers, multiplying the contents of the first plurality of m-bit registers by $\alpha$ to produce a plurality of second m-bit parallel multiplication results, where $\alpha$ is a non-zero element of $GF(2^m)$, and storing the plurality of second m-bit parallel multiplication results back to the first plurality of m-bit registers.

DETAILED DESCRIPTION OF THE PREFERRED EMBODIMENTS

Figure 3:
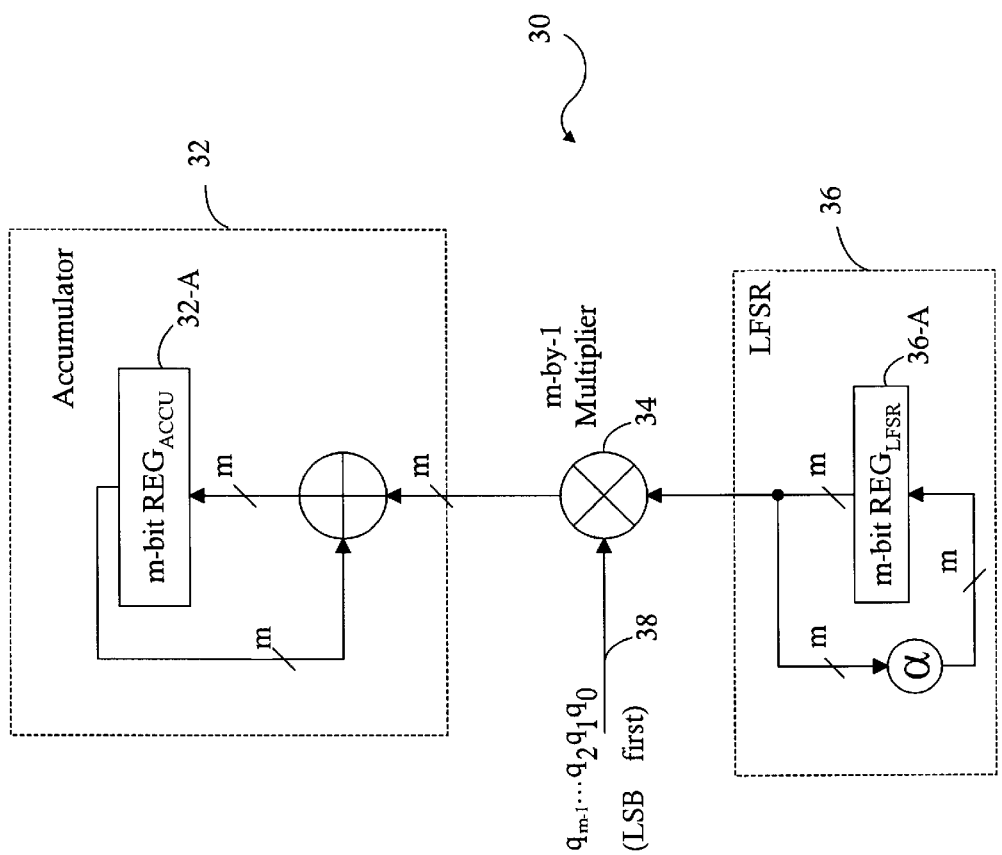
FIG. 3 is a schematic illustration of a bit-serial multiplier of the serial-in parallel-out type to implement equations (8) and (9) in accordance with the present invention.

FIG. 3 schematically illustrates a serial-in parallel-out (SIPO) standard basis bit-serial multiplier 30 employed in the present invention to implement equations (8) and (9). The multiplier 30 of FIG. 3 includes an accumulator 32, an m-by-one multiplier 34, a linear feedback shift register (LFSR) 36 wired to multiply itself by $\alpha$, and an LSB-first serial input 38. Multiplier 30 requires m sequential clock cycles to complete an operation.

To illustrate the operation of FIG. 3, assume that a $+Q \cdot b$ is to be computed, where $\alpha$ and b are two elements in $GF(2^m)$. Then, as a matter of necessity, Q is expressed in the standard basis as:

$$Q = q_0 q_1 \alpha + q_2 \alpha^2 + \ldots + q_{m-1} \alpha^{m-1} \tag{14}$$

To compute $a+Q \cdot b$, multiplier 30 performs m sequential computation cycles as described below.

Initialization: $REG_{ACCU} = a$, $REG_{LFSR} = b$ (15)

Begin
do i=1,2, . . . , m $REG_{ACCU} \leftarrow REG_{ACCU} + q_{i-1} REG_{LFSR}$ (16)

$REG_{LFSR} \leftarrow \alpha \cdot REG_{LFSR}$ (17)

enddo
End where $REG_{ACCU}$ designates the accumulation register 32-A, $REG_{LFSR}$ designates the LFSR register 36-A, index "i" indicates the i-th computation cycle, and the notation ← means "simultaneous assignment upon a clock trigger."

It can be seen by those skilled in the art that, after m clock cycles, $REG_{LFSR}$ contains $\alpha^m \cdot b$ and $REG_{ACCU}$ contains the desired value of $a+Q \cdot b$. It should be noted that the serial input 38 receives the binary digits of Q in the order of $q_0$, $q_1$, . . . , and $q_{m-1}$, i.e., LSB first.

By employing the multiplier 30 of FIG. 3, the bit-serial realization of equations (8) and (9) is given by
do i=1,2, . . . ,m $INV \leftarrow \alpha^{-1} \cdot INV$ (18)

$A(x) \leftarrow A(x) - q_{i-1} B(x) \cdot x^{deg\_A(x) - deg\_B(x)}$ (19)

$B(x) \leftarrow \alpha \cdot B(x)$ (20)

$A'(x) \leftarrow A'(x) - q_{i-1} B'(x) \cdot x^{deg\_A(x) - deg\_B(x)}$ (21)

$B'(x) \leftarrow \alpha B'(x)$ (22)

enddo
where index "i" indicates the i-th computation cycle.

It should be noted that INV is updated along with B(x) because INV is the inverse of the leading coefficient of B(x). With the above bit-serial computations, the present invention makes some further modifications to the foregoing conventional modified Euclidean algorithm.

As shown, B(x) and B'(x) are multiplied by $\alpha$ a total of m times in each Euclidean iteration; it follows that $$B(x) \leftarrow \alpha^m \cdot B(x) \tag{23}$$

and $$B'(x) \leftarrow \alpha^m \cdot B'(x) \tag{24}$$

which should be appended to equations (8) and (9), respectively.

This modification does not affect the validity of the solutions of $\Lambda(x)$ and $\Omega(x)$.

Figure 4:
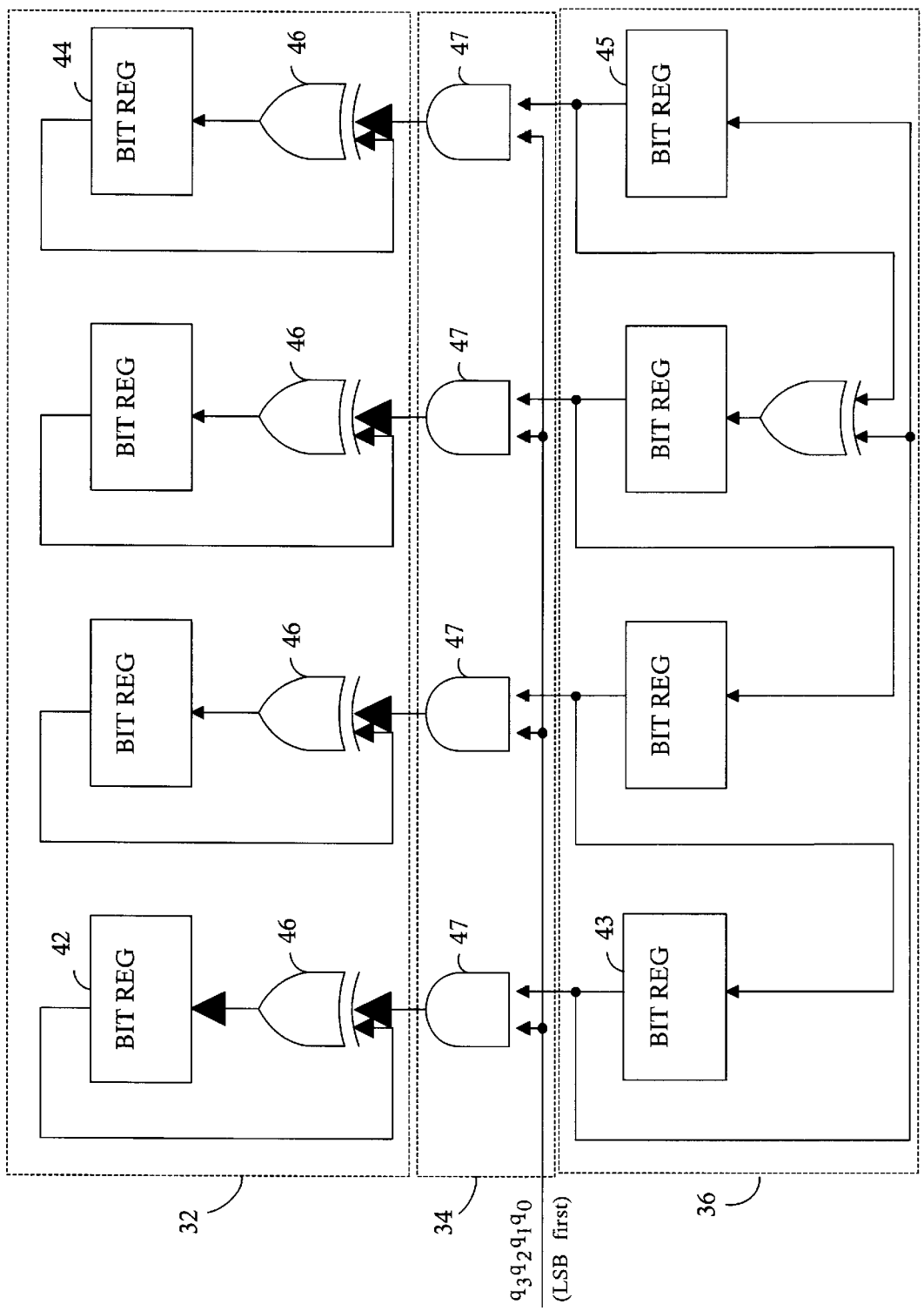
FIG. 4 is an expanded circuit diagram of the FIG. 3 embodiment illustrating a degree m equal to 4.

FIG. 4 is a circuit diagram implementing the system of FIG. 3. The four upper-side bit resisters correspond to $REG_{ACCU}$ of FIG. 3. The four lower-side bit registers correspond to $REG_{LFSR}$ of FIG. 3. For illustration, m=4 and the associated field generator polynomial is $$f(x) = x^4 + x + 1 \tag{25}$$

According to a convention followed by those skilled in the art, the left-most bit registers 42 and 43 correspond to the most significant bits (MSBs) and the right-most bit registers 44 and 45 correspond to the least significant bits (LSBs). As shown in FIG. 4, a plurality of XOR gates 46 are implemented to perform the function of addition and a plurality of AND gates 47 are implemented to perform the function of multiplication.

Figure 2:
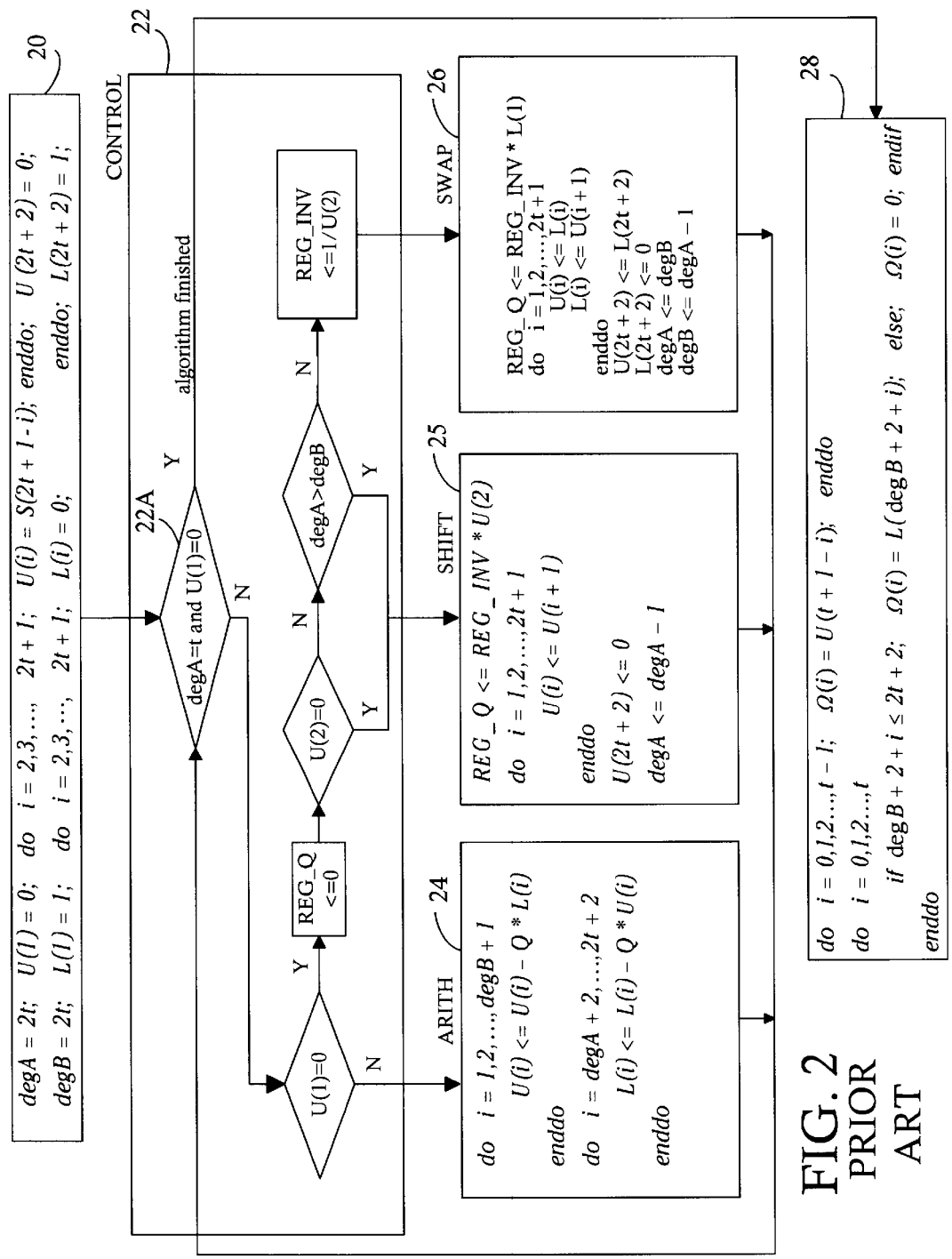
FIG. 2 is a flow chart describing the operation of the key equation solver of FIG. 1.
Figure 5:
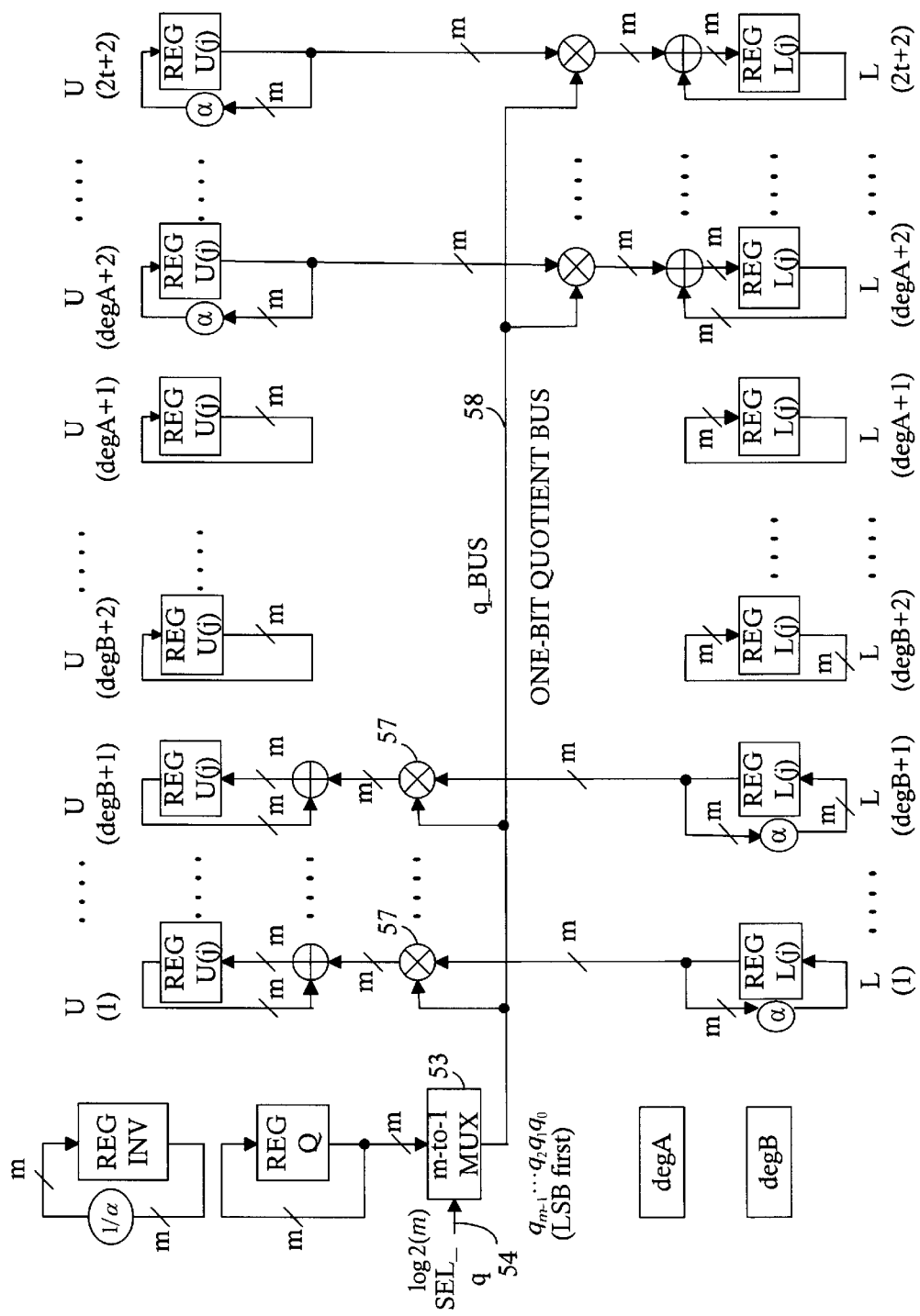
FIG. 5 is a schematic illustration of a circuit structure using the bit-serial multiplier of FIG. 3 to implement the arithmetic of equations (8) and (9) in accordance with the present invention.

FIG. 5 schematically illustrates a circuit structure using the bit-serial multiplier of FIG. 3 to perform the arithmetic of equations (8) and (9) in accordance with the present invention. More specifically, the ARITH block 24 in FIG. 2 is replaced by the following m computation cycles:
do i=1,2, . . . ,m
SEL_q selects $q_{i-1}$ $REG\_INV \leftarrow REG\_INV/\alpha$ (26)

do j=1,2, . . . ,degB+1

$U(j) \leftarrow U(j) + q_{i-1} L(j)$ (27)

$L(j) \leftarrow L(j)$ (28)

enddo
do j=degB+2, . . . ,degA+1

$U(j) \leftarrow U(j); L(j) \leftarrow L(j)$ (29)

enddo
do j=degA+2 , . . . ,2t+2

$L(j) \leftarrow L(j) + q_{i-1} U(j)$ (30)

$U(j) \leftarrow \alpha \cdot U(j)$ (31)

enddo
enddo

It should be noted that the multipliers used for register U(j) and register L(j), j=degA+2, . . . ,2t+2, are upside-down reversed. Moreover, the register REG_INV is wired to divide itself by $\alpha$, and transmission of the digits of register REG_Q is controlled by the m-to-one multiplexer 53 based on a signal SEL-q received from a system controller unit (not shown in FIG. 5). The value of Q is computed in the previous Euclidean iteration.

Figure 1:
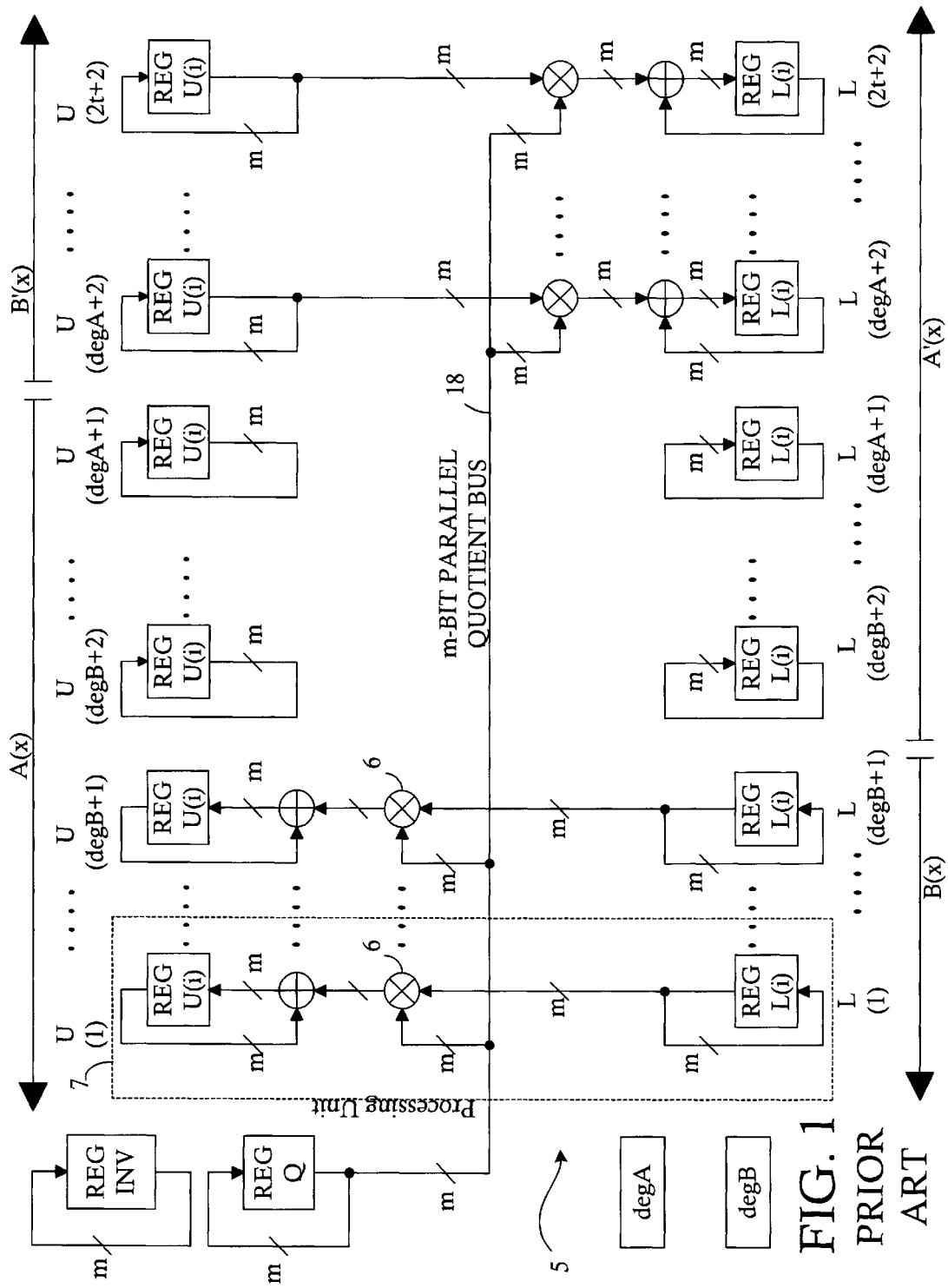
FIG. 1 is a schematic illustration of a conventional Euclidean algorithm based key equation solver using parallel multipliers.

The advantages of implementing the key equation solver of the present invention as shown in FIG. 5 as compared with the conventional key equation solver as shown in FIG. 1 are at least two-fold. First, FIG. 1 utilizes m-by-m parallel multipliers 6, while FIG. 5 uses bit-serial multipliers 57, thereby reducing the complexity of the combination logic from $m^2$ to m. Secondly, FIG. 5 uses a global quotient bus q_BUS 58 which is bit-serial and one-bit only. By contrast, FIG. 1 uses an m-bit parallel (e.g., 8 bits) quotient bus 18.

As noted above, in FIG. 5, each LFSR is wired to multiply itself by $\alpha$, and the quotient bus 58 is LSB first. A straightforward modification is as follows:

The LFSRs are wired to multiply by $\alpha^{-1}$, the serial digits transmitted via the one-bit quotient bus 58 are MSB first, and the value transmitted by the quotient bus 58 is $\alpha^{m-1} \cdot Q$. Then, the value of $\alpha^{m-1} \cdot Q$ can be generated by multiplying $\alpha^{m-1} \cdot INV$ by $a_{lead}$, and the value of $\alpha^{m-1} \cdot INV$ can be obtained by a look up table. Additionally, while the LFSRs are multiplied by $\alpha^{-1}$, INV should be multiplied by $\alpha$.

Figure 6:
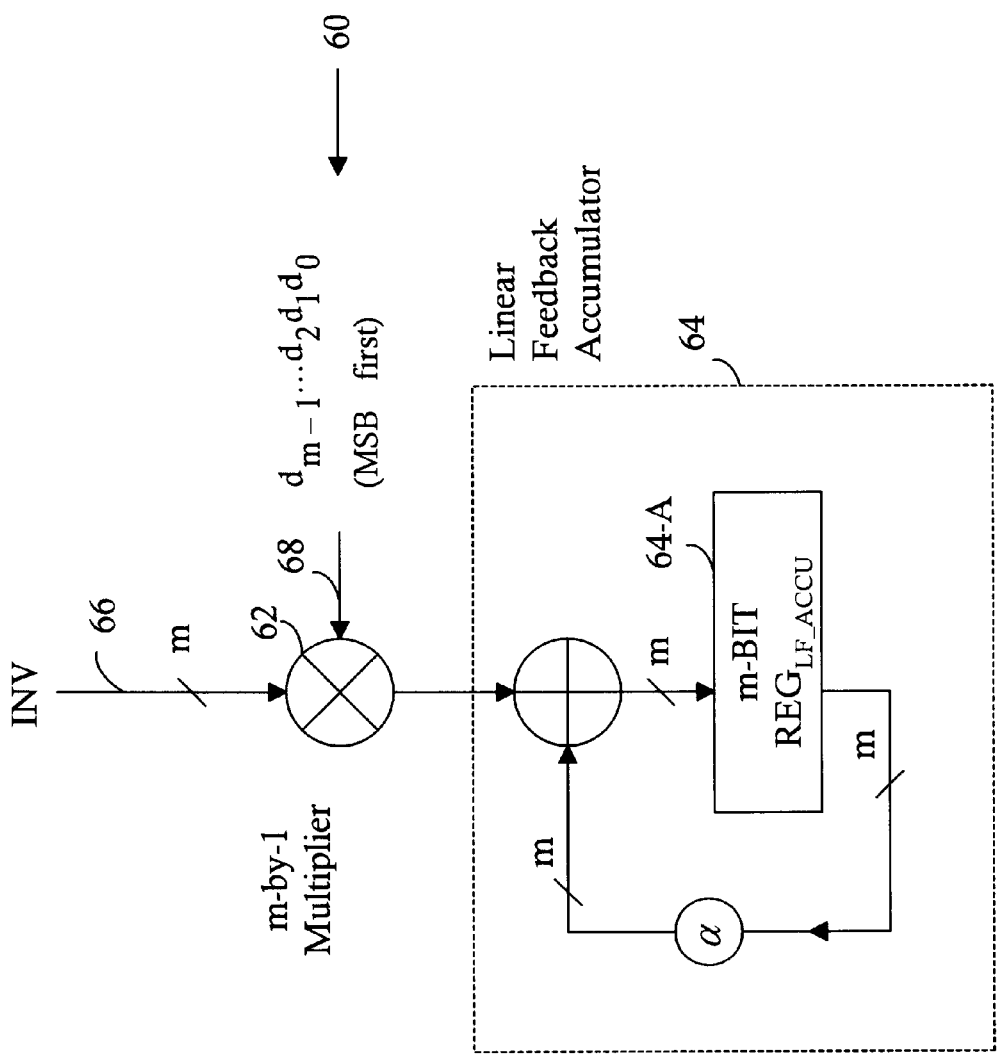
FIG. 6 is a schematic illustration of an alternative bit-serial multiplier of the serial-in parallel-out type to implement equation (12) in accordance with the present invention.

FIG. 6 schematically illustrates another SIPO standard basis bit-serial multiplier unit 60 to determine quotient value Q. In FIG. 6, multiplier 60 includes an m-by-one multiplier 62, a linear feedback accumulator 64, a parallel input 66, and a MSB-first serial input 68.

First, assume that $a_{lead} \cdot INV$, the value of Q given by equation (12), is to be computed and that $a_{lead}$ is expressed in the standard basis as $$a_{lead} = d_0 + d_1\alpha + d_2\alpha^2 + \ldots + d_{m-1} \quad (32)$$

To compute Q, the bit-serial multiplier 60 of FIG. 6 performs the following operations:
Initialization: $REG_{LF\_ACCU} = 0$
Begin
do i=1,2, ... ,m $$REG_{LF\_ACCU} \leftarrow \alpha \cdot REG_{LF\_ACCU} + d_{m-i} INV \quad (33)$$

enddo
End
where $REG_{LF\_ACCU}$ designates m-bit register 64-A of the linear feedback accumulator 64 and index "i" indicates the i-th computation clock cycle. After m computation cycles, register $REG_{LF\_ACCU}$ will contain the desired value of Q.

By employing the multiplier of FIG. 6, the bit-serial realization of equation (12) is given below as:
Initialization: Q=0
Begin
do i=1,2, ... ,m $$Q \leftarrow \alpha \cdot Q + d_{m-i} INV \quad (34)$$

enddo
End

The serial input 68 receives the binary digits of $a_{lead}$ in the order of $d_{m-1}, d_{m-2}, \ldots$, and $d_0$, i.e., MSB first. The parallel input 66 receives the binary digits of INV which is $(b_{lead})^{-1}$. As noted above, $Q = a_{lead}/b_{lead}$.

Figure 7:
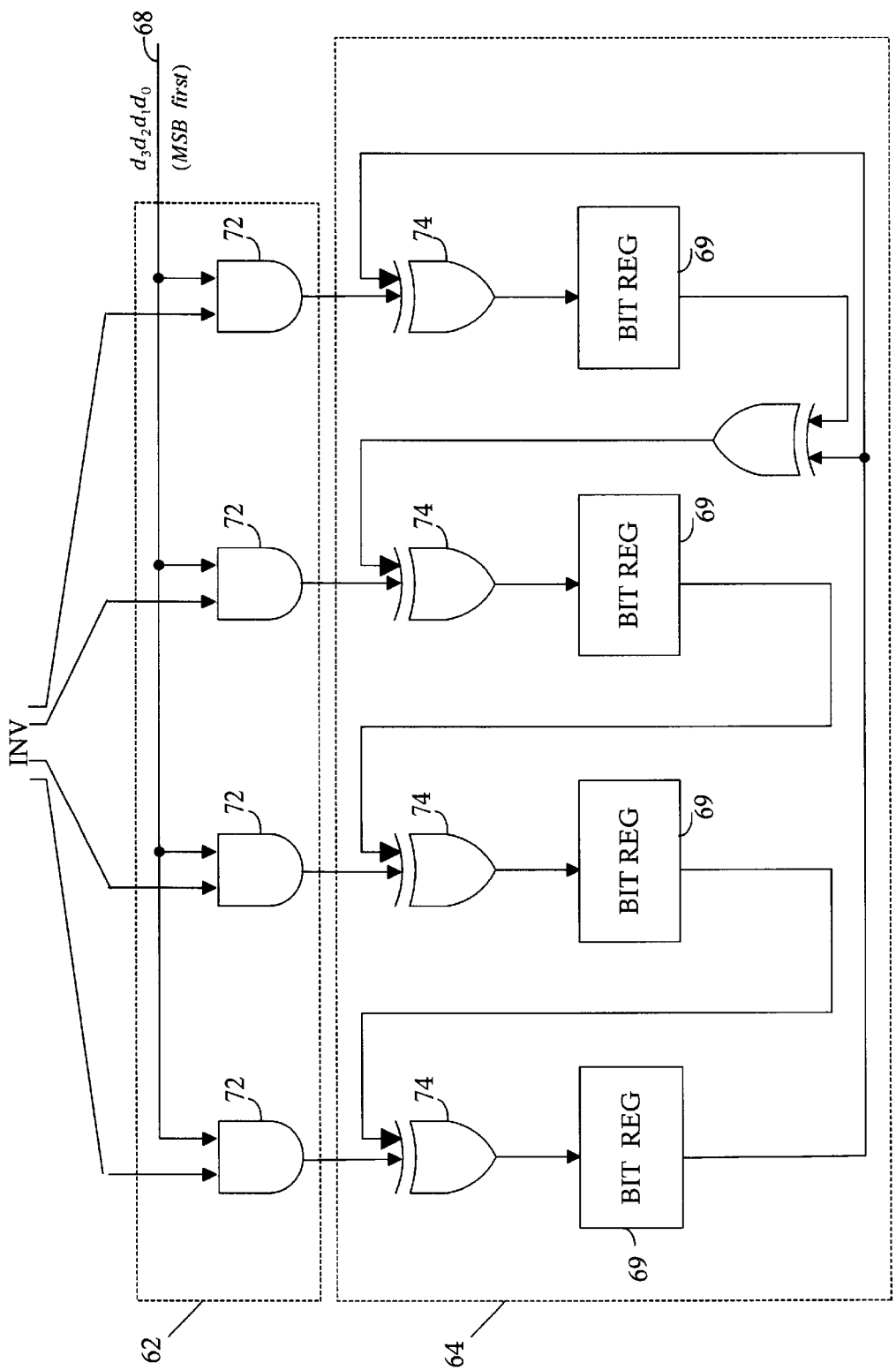
FIG. 7 is an expanded circuit diagram associated with the FIG. 6 system with a degree m equal to 4.

FIG. 7 is an expanded circuit diagram of FIG. 6 with a degree m equal to 4. In particular, AND gates 72 are used to perform the multiplication, and XOR gates 74 are used to perform accumulation. In FIG. 7, each of the four registers 69 is a bit register; together, registers 69 construct the m-bit $REG_{LF\_ACCU}$ of FIG. 6.

Figure 8:
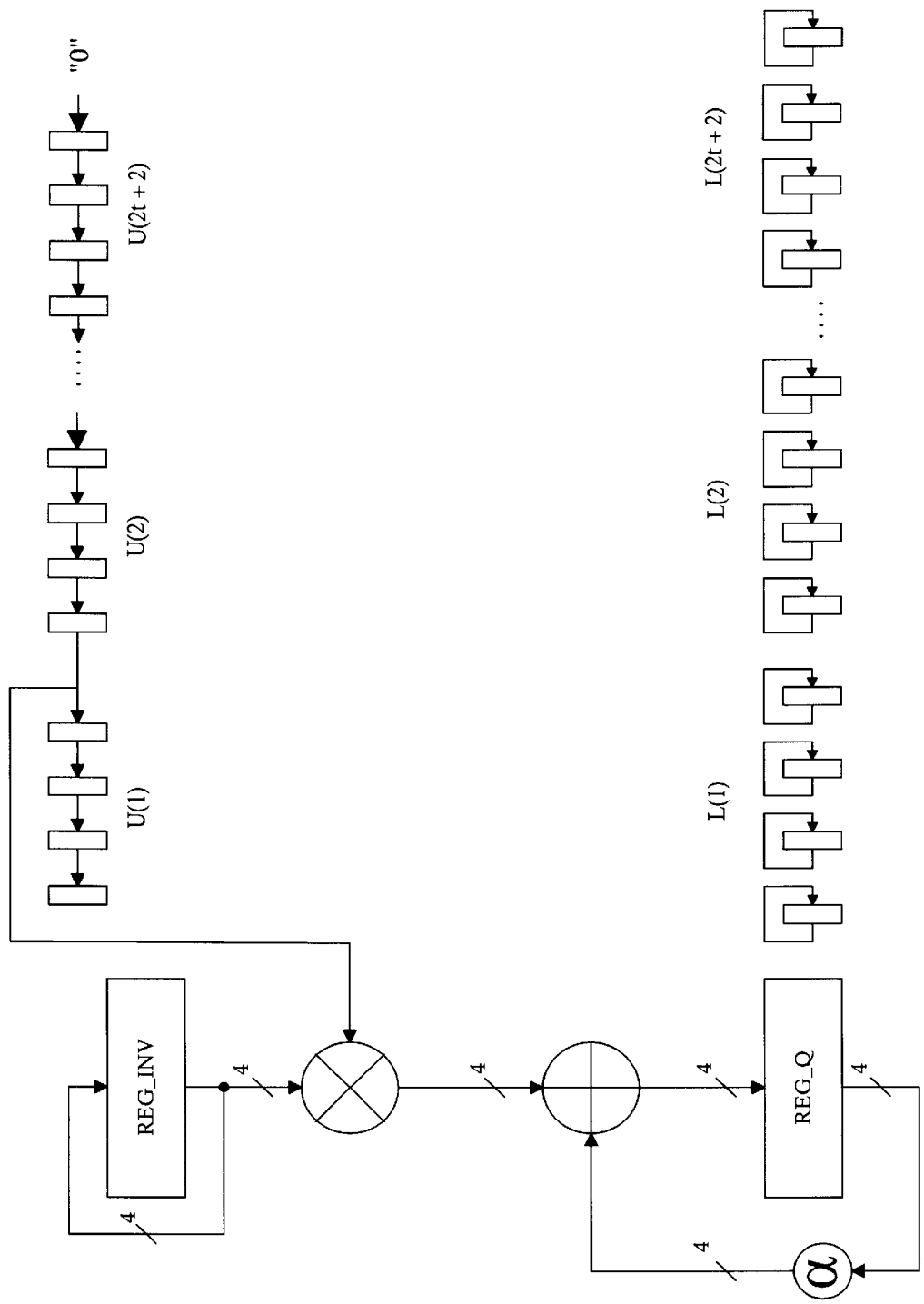
FIG. 8 is a schematic illustration of a bit-serial implementation of the shift operation in accordance with the present invention.

FIG. 8 schematically illustrates a bit-serial implementation in accordance with the present invention of the SHIFT block 25 of FIG. 2 with a degree m equal to four. In particular, the contents of upper-side registers U(i) are shifted to registers U(i−1) for i=2,3, ... ,2t+2, while lower-side registers L(•) remain unchanged. Additionally, register U(2t+2) is filled by zeros.

Figure 9:
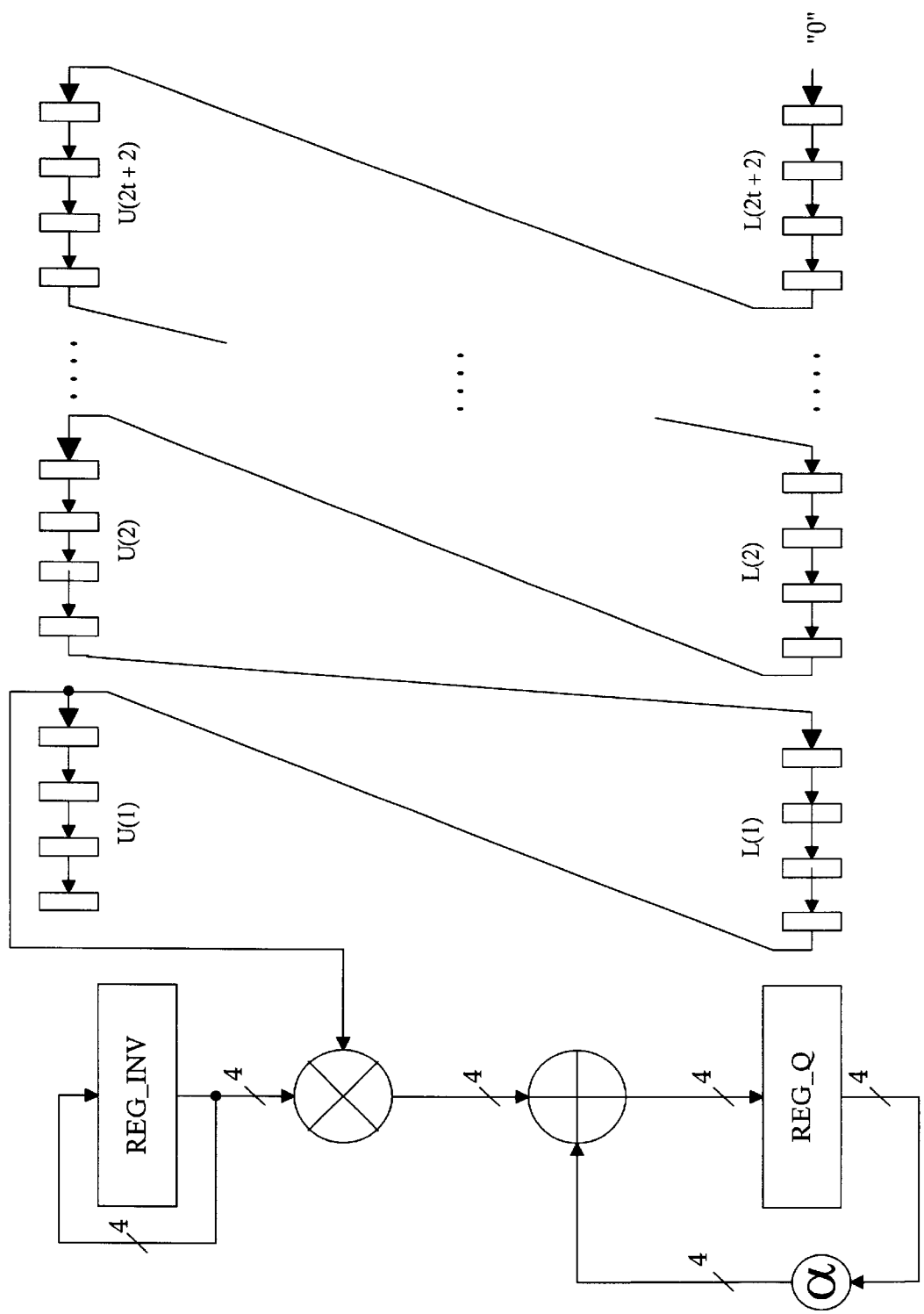
FIG. 9 is a schematic illustration of a bit-serial implementation of the swap operation in accordance with the present invention.

FIG. 9 schematically illustrates a bit-serial implementation in accordance with the present invention of the SWAP block 26 of FIG. 2. The contents of registers {U(1), ... ,U(2t+2)} are replaced with those of registers {L(1), ... ,L(2t+2)} and the contents of registers {L(1), ... , L(2t+2)} are replaced, simultaneously, with those of registers {U(2), ... , U(2t+2)}. Additionally, register L(2t+2) is filled with zeros.

In SHIFT block 25 or SWAP block 26, binary digits in every m-bit register for shifting or swapping are shifted in and shifted out in the order of MSB first. While registers are shifting or swapping (FIGS. 8 and 9), the value of Q must be computed, which value will be used in the next Euclidean iteration. In this condition, REG_INV is kept frozen and REG_Q is configured as a SIPO multiplier of FIG. 6. The corresponding bit-serial operations are given by $$REG\_Q = 0 \quad (35)$$

do i=1,2, ... , m $$REG\_Q \leftarrow \alpha REG\_Q + d_{m-i} REG\_INV \quad (36)$$

enddo
where the initialization of resetting the register value REG_Q to zero is completed in the preceding CONTROL block 22 of FIG. 2.

Figure 10:
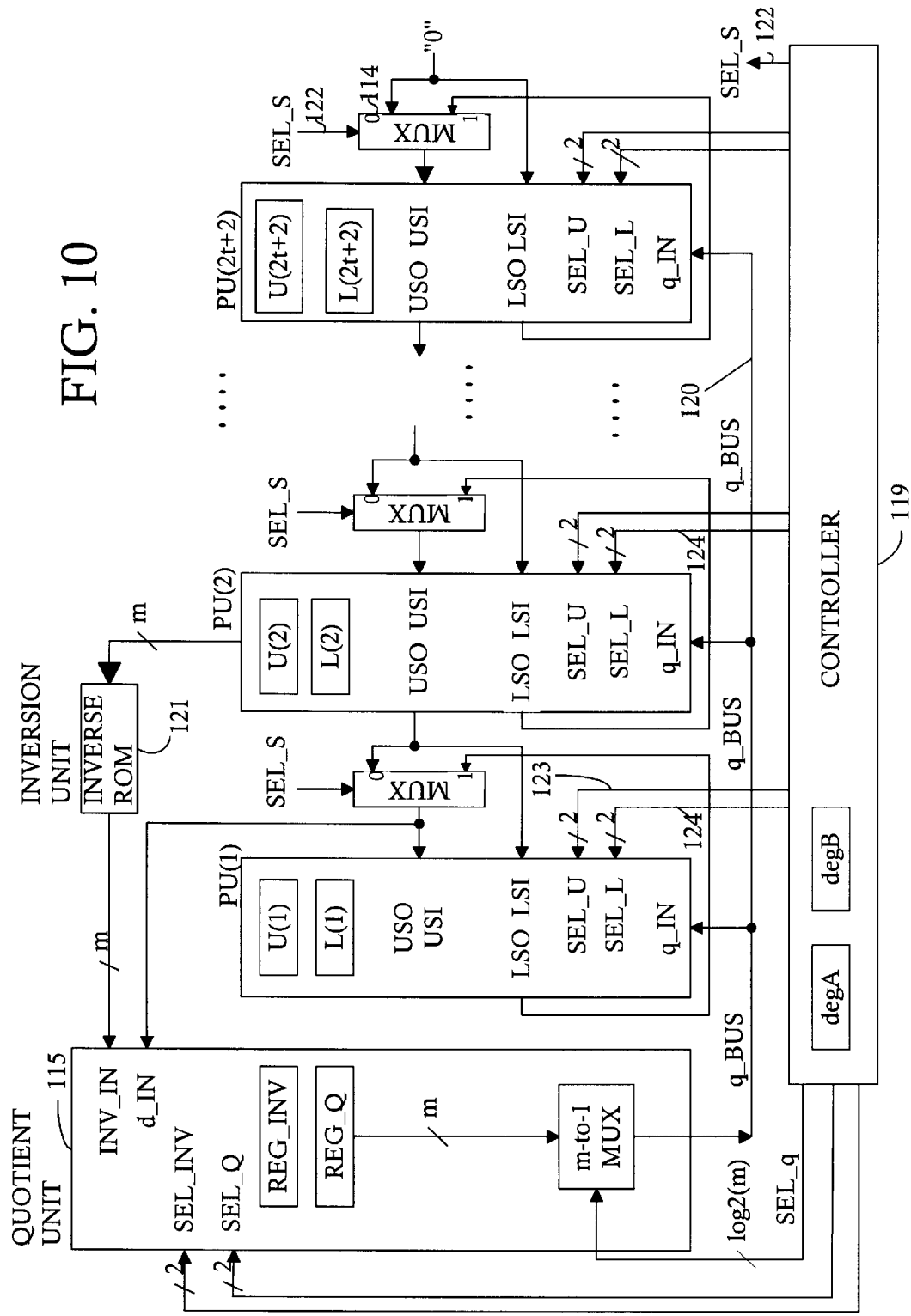
FIG. 10 illustrates the system structure of the bit-serial key equation solver of the present invention.

FIG. 10 illustrates a system structure of the key equation solver of FIGS. 5, 8 and 9. Registers U(i) and L(i) are contained in the i-th processing unit PU(i), i=1,2, ... ,(2t+2). Each PU(i), $1 \leq i \leq 2t+2$ is followed by a 2-to-1 multiplexer 114. REG_Q and REG_INV are contained in a quotient unit 115. Register degA and register degB are contained in a controller unit 119. The one-bit quotient bus q_BUS 120 is used to transmit Q in bit-serial mode. Additionally, an inversion unit 121 is used to generate the value of INV typically by a look-up table.

In FIG. 10, each processing unit PU(1), PU(2), ... , PU(2t+2) is followed by a 2-to-1 multiplexer 114 which is controlled by SEL_S input 122 from controller 119. In accordance with SEL_U input 123 and SEL_L input 124 from controller 119, a processing unit PU is able to perform various configurations as shown below in Table 1.

TABLE 1

| Configuration of PU | SEL_U | SEL_L | SEL_S | Usage |
|---|---|---|---|---|
| Frozen | 0 | 0 | x | CONTROL or ARITH |
| MAC | 1 | 3 | x | ARITH |
| Upside-down MAC | 3 | 1 | x | ARITH |
| Shifting | 2 | 0 | 0 | SHIFT |
| Swapping | 2 | 2 | 1 | SWAP | where notation "x" in the column of SEL_S represents "don't-care."

A circuit for implementing INITIALIZATION block 20 of FIG. 2 (i.e., for carrying out equation (6)) in the system of FIG. 10 can be readily devised by those of ordinary skill in the art.

Figure 11:
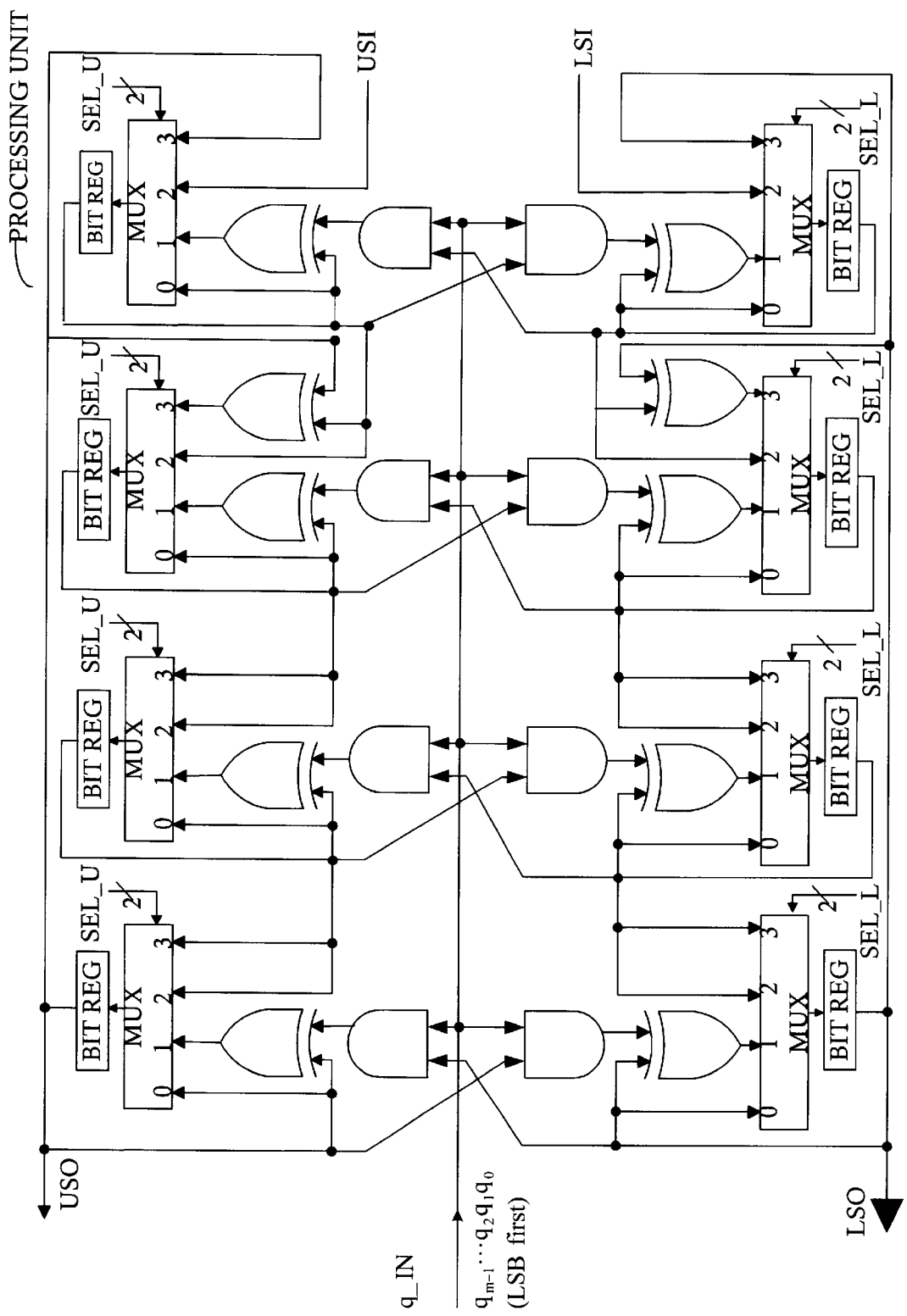
FIG. 11 shows an embodiment of a processing unit of the bit-serial key equation solver of the present invention with a degree m=4.

FIG. 11 illustrates a preferred circuit embodiment of the processing unit PU of FIG. 10 with a degree m=4. In FIG. 11, the four upper-side registers are bit registers which construct the m-bit register U(i). The four lower-side registers are bit registers which construct the m-bit register L(i). Registers U(•) and L(•) can be configured so as to perform the various bit-serial operations required by the ARITH block, SHIFT block, and SWAP block as disclosed in, e.g., FIGS. 5, 8, and 9.

In the frozen configuration as shown in Table 1, registers U(•) and L(•) are kept unchanged. In the MAC configuration, the processing unit becomes equivalent to the MAC shown in FIG. 4. In the upside-down MAC configuration, the processing unit becomes equivalent to the upside-down version of the MAC shown in FIG. 4. In the shifting configuration, registers U(•) become bit shift registers to shift in and out their contents while registers L(•) are kept unchanged. In the swapping configuration, registers U(•) and L(•) become bit shift registers. While shifting or swapping, the SEL_S input controls the routing of the flow of bit streams.

The circuit shown in FIG. 11 can be implemented for all processing units PU(1), PU(2), . . . , PU(2t+2) shown in FIG. 10. With regard to prior art FIG. 2, the present inventor has realized that the register U(1) in the processing unit PU(1) may be replaced with a single bit register to indicate whether U(1) is zero or not, the configuration of the normal MAC is not necessary for the processing unit PU(2t+2), and the configuration of the upside-down MAC is not necessary for the processing units PU(1), PU(2), . . . , and PU(t+1), and hence the circuits of the above mentioned processing units can be reduced.

Figure 12:
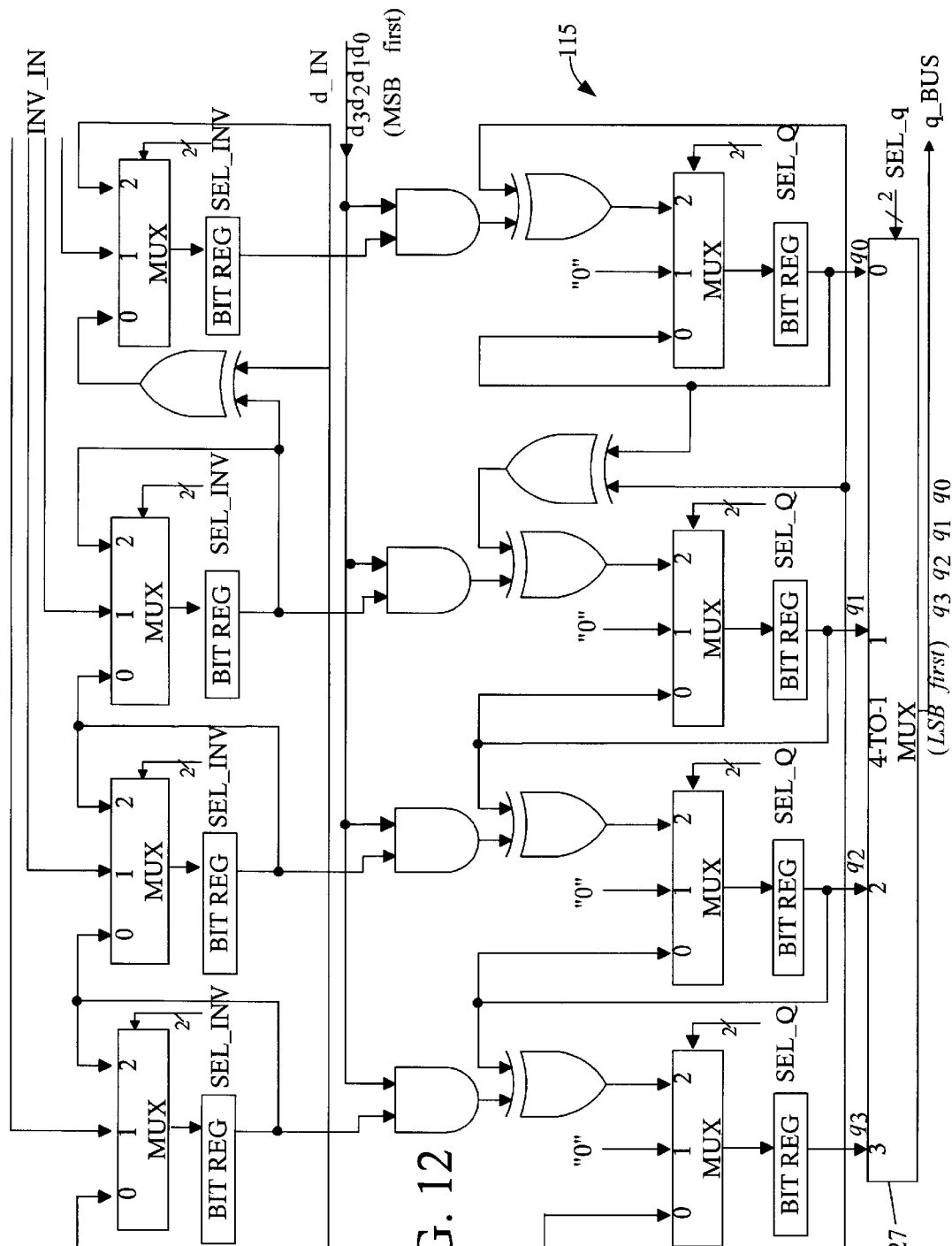
FIG. 12 is a circuit diagram of the quotient unit of the bit-serial key equation solver of the present invention with a degree m equal to 4.

FIG. 12 is a circuit diagram of the quotient unit 115 shown in FIG. 10 with a degree m=4. In accordance with the present invention, register REQ_Q and register REG_INV can be configured so as to perform the various bit-serial operations required by the CONTROL block, ARITH block, SHIFT block, and the SWAP block as shown in FIGS. 5, 8, and 9. For example, if a selector SEL_INV selects 0, then the value in the register REG_INV is wired to divide by α. If the selector SEL_INV selects 1, then the value in the register REG_INV is loaded with the value of parallel input INV_IN. If the selector SEL_INV selects 2, then the value of register REG_INV is frozen. On the other hand, if a selector SEL_Q selects 0, then the value of register REG_Q is frozen. If the selector SEL_Q selects 1, then the value in register REG_Q is reset to zero. If the selector SEL_Q selects 2, then register REG_Q is configured to perform the operation of the multiplier of FIG. 7.

The selector SEL_q is used to control a 4-to-1 multiplexer 127 to transmit the digits of the quotient over the one-bit quotient bus q_BUS 120. In FIG. 12, the upper-side bit registers form REG_INV, and the lower-side bit registers form REG_Q.

The advantages of the present invention include (1) using only standard basis representation to avoid complexities relating to basis change; (2) serially transmitting the m-bit quotient value bit-serially on a one-bit bus; (3) performing swapping and shifting of registers bit-serially to reduce cross-wiring between registers; (4) eliminating the need for a serial-to-parallel conversion register; and (5) reducing the complexity of combination logic from $m^2$ to m.

While particular embodiments of the present invention have been shown and described, it will be apparent to those skilled in the art that various changes and modifications may be made therein without departing from the spirit or scope of the invention. Accordingly, it is intended that the appended claims cover such changes and modifications that come within the spirit and scope of the invention. For example, various bit-serial multipliers or other multipliers may be used as the multiplier in the quotient unit of the present invention.

What is claimed is:

1. An apparatus for generating an error location polynomial for decoding an error correction code over $GF(2^m)$, said apparatus comprising:

(a) a one-bit quotient bus for bit-serially transmitting m quotient digits of an m-bit quotient value; and (b) a plurality of processing units each bit-serially receiving said quotient digits from said one-bit quotient bus and each including:

(i) a first m-bit register;

(ii) an m-by-one multiplier for multiplying contents of said first register by one of said quotient digits received from said one-bit quotient bus to produce an m-bit parallel multiplication result;

(iii) a second m-bit register; and (iv) an adder for adding said m-bit multiplication result with contents of said second register to provide an m-bit addition result for replacing said contents of said second register, wherein said m-by-one multiplier comprises m AND gates, said adder comprises m exclusive OR gates, and said second register and said adder are configured to provide an accumulator for accumulating said m-bit multiplication result of said m-by-one multiplier.

2. An apparatus as in claim 1, further comprising;

(a) an inversion means for generating an m-bit output in response to an m-bit value received from one of said processing units; and (b) a quotient means for generating said m-bit quotient value by multiplying said m-bit output of said inversion means by an m-bit value received from one of said processing units and for transmitting said m-bit quotient value bit-serially on said one-bit quotient bus.

3. An apparatus as in claim 1, wherein said first m-bit register forms a linear feedback shift register which multiplies contents of said first register by α and stores the multiplication result back to said first register, where α is a non-zero element of $GF(2^m)$.

4. An error correction circuit for correcting bit errors in a received codeword encoded by an error correction code over $GF(2^m)$, said circuit comprising:

(a) means for generating a syndrome polynomial S(x) by computing power sums of symbols of said received codeword;

(b) means for solving the key equation $Ω(x)=Λ(x)S(x)$ mod $x^{2t}$ to generate an error location polynomial Λ(x) representing error locations of said errors in said codeword and an error evaluation polynomial Ω(x) used to determine error values of said errors;

(c) means for determining roots of said error location polynomial Λ(x), each of said roots indicating an error location;

(d) means for determining error values from said roots; and (e) means for generating a corrected codeword from said error locations, said error values and said received codeword, wherein:

said means for solving said key equation comprises a one-bit quotient bus for bit-serially transmitting m quotient digits of an m-bit quotient value and a plurality of processing units each bit-serially receiving said quotient digits from said bus and each including:

(i) a first m-bit register;

(ii) an m-by-one multiplier for multiplying contents of said first register by one of said quotient digits received from said one-bit quotient bus to produce an m-bit parallel multiplication result;

(iii) a second m-bit register; and (iv) an adder for adding said m-bit multiplication result with contents of said second register to provide an m-bit addition result for replacing said contents of said second register, wherein said m-by-one multiplier comprises m AND gates, said adder comprises m exclusive OR gates, and said second register and said adder are configured to provide an accumulator for accumulating said m-bit multiplication result of said m-by-one multiplier.

5. An apparatus as in claim 4, wherein said means for solving the key equation further comprises:

(a) an inversion means for generating an m-bit output in response to an m-bit value received from one of said processing units; and (b) a quotient means for generating said m-bit quotient value by multiplying said m-bit output of said inversion means by an m-bit value received from one of said processing units and for transmitting said m-bit quotient value bit-serially on said one-bit quotient bus.

6. An apparatus as in claim 4, wherein said first m-bit register forms a linear feedback shift register which multiplies contents of said first register by $\alpha$ and stores the multiplication result back to said first register, where $\alpha$ is a non-zero element of $GF(2^m)$.

7. A method of performing arithmetic operations for generating an error location polynomial for decoding an error correction code over $GF(2^m)$, each of said arithmetic operations including m computation steps each of which comprises:

(a) receiving one of m quotient digits of an m-bit quotient value;

(b) multiplying contents of a first plurality of m-bit registers by said one of said quotient digits to produce a plurality of first m-bit parallel multiplication results;

(c) accumulating said plurality of first m-bit parallel multiplication results in a second plurality of m-bit registers;

(d) multiplying said contents of said first plurality of m-bit registers by $\alpha$ to produce a plurality of second m-bit parallel multiplication results, where $\alpha$ is a non-zero element of $GF(2^m)$; and (e) storing said plurality of second m-bit parallel multiplication results back to said first plurality of m-bit registers.

8. A method as in claim 7, wherein said m-bit quotient value is generated prior to said m computation steps, and is obtained by multiplying a first m-bit value by the multiplicative inverse value of a second m-bit value, said first and second m-bit values being received respectively from said first plurality of registers and said second plurality of registers.

9. A method of correcting bit errors in a received codeword encoded by an error correction code over $GF(2^m)$, said method comprising:

(a) generating a syndrome polynomial $S(x)$ by computing power sums of symbols of said received codeword;

(b) solving the key equation $\Omega(x)=\Lambda(x)S(x) \bmod x^{2t}$ to generate an error location polynomial $\Lambda(x)$ representing error locations of said errors in said received codeword and an error evaluation polynomial $\Omega(x)$ used to determine error values of said errors;

(c) determining roots of said error location polynomial $\Lambda(x)$, each of said roots indicating an error location;

(d) determining error values from said roots; and (e) generating a corrected codeword from said error locations, said error values and said received codeword, wherein:

step (b) for solving the key equation performs arithmetic operations each including m computation steps each of which includes receiving one of m quotient digits of an m-bit quotient value, multiplying contents of a first plurality of m-bit registers by said one of said quotient digits to produce a plurality of first m-bit parallel multiplication results, accumulating said plurality of first m-bit parallel multiplication results in a second plurality of m-bit registers, multiplying said contents of said first plurality of m-bit registers by $\alpha$ to produce a plurality of second m-bit parallel multiplication results, where $\alpha$ is a non-zero element of $GF(2^m)$, and storing said plurality of second m-bit parallel multiplication results back to said first plurality of m-bit registers.

10. A method as in claim 9, wherein said m-bit quotient value is generated prior to said m computation steps, and is obtained by multiplying a first m-bit value by the multiplicative inverse value of a second m-bit value, said first and second m-bit values being received respectively from said first plurality of registers and said second plurality of registers.

* * * * *